(12) United States Patent
Ancora et al.

(10) Patent No.: US 7,984,365 B2
(45) Date of Patent: Jul. 19, 2011

(54) TURBO DECODER WITH STAKE HERITAGE FOR DATA BLOCK REDUNDANT VERSION DECODING

(75) Inventors: Andrea Ancora, Nice (FR); Fabrizio Tomatis, Saint Laurent du Var (FR)

(73) Assignee: ST-Ericsson SA, Geneva (CH)

( * ) Notice: Subject to any disclaimer, the term of this patent is extended or adjusted under 35 U.S.C. 154(b) by 410 days.

(21) Appl. No.: 11/720,830

(22) PCT Filed: Nov. 30, 2005

(86) PCT No.: PCT/IB2005/053963
§ 371 (c)(1),
(2), (4) Date: May 17, 2010

(87) PCT Pub. No.: WO2006/059280
PCT Pub. Date: Jun. 8, 2006

(65) Prior Publication Data
US 2010/0241935 A1 Sep. 23, 2010

(30) Foreign Application Priority Data
Dec. 2, 2004 (EP) .................................. 04300839

(51) Int. Cl.
*H03M 13/00* (2006.01)
(52) U.S. Cl. .................... 714/784; 714/773; 714/789
(58) Field of Classification Search ................. 714/758, 714/704, 780, 801, 799, 786, 755, 774, 781
See application file for complete search history.

(56) References Cited

U.S. PATENT DOCUMENTS

| | | | |
|---|---|---|---|
| 6,028,987 A | 2/2000 | Wang | |
| 6,732,327 B1 | 5/2004 | Heinila | |
| 6,751,770 B2 * | 6/2004 | Morelos-Zaragoza | 714/781 |
| 2002/0010894 A1 | 1/2002 | Wolf et al. | |
| 2003/0101402 A1 * | 5/2003 | Amrani et al. | 714/755 |
| 2003/0225985 A1 * | 12/2003 | Suzuki et al. | 711/157 |
| 2004/0111659 A1 | 6/2004 | Lu et al. | |

FOREIGN PATENT DOCUMENTS

| | | |
|---|---|---|
| WO | 03/098811 A2 | 11/2003 |
| WO | 2004/028004 A2 | 4/2004 |

OTHER PUBLICATIONS

"Universal Mobile Telecommunications System (UMTS)", ETSI Standards, European Telecommunications, Jun. 2004.
"Performance Analysis of Turbo Decoder for 3GPP Standard Using the Sliding Windoe Algorithm" M Marandian et al, Sep. 30, 2001, 12th IEEE International Symposium on Personal, Indoor and Mobile Radio Communications.
Marandian, Mohamadreza, et al., "Performance Analysis of Turbo Decoder for 3GPP Standard using the Sliding Window Algorithm", 12th IEEE International Symposium on Personal, Indoor and Mobile Radio Communications, PIMRC 2001, [Online] Sep. 30, 2001, pp. E-127-E-131, XP002403879 San Diego retrieved from the Internet: URL: http://ieeexplore.ieee.org/xpls/abs_all.jsp?arnumber=965275.

* cited by examiner

*Primary Examiner* — Fritz Alphonse
(74) *Attorney, Agent, or Firm* — William J. Kubida; Peter J. Meza; Hogan Lovells US LLP

(57) ABSTRACT

An iterative decoding device for a communication receiver includes a decoder for decoding received encoded data blocks by a next iteration initialization, a controller to choose one of the first and second hard decision bits in order for the validity of a CRC field, associated to this received data block, to be checked, and a first memory. The controller, when the CRC field of a block is invalid, orders the decoder to store the final stakes associated to the block in the first memory to require the transmission of a redundant version of the block, and when the redundant version is received, to initialize the decoder with the stored final stakes before it applies the next iteration initialization mechanism to the received redundant version.

11 Claims, 1 Drawing Sheet

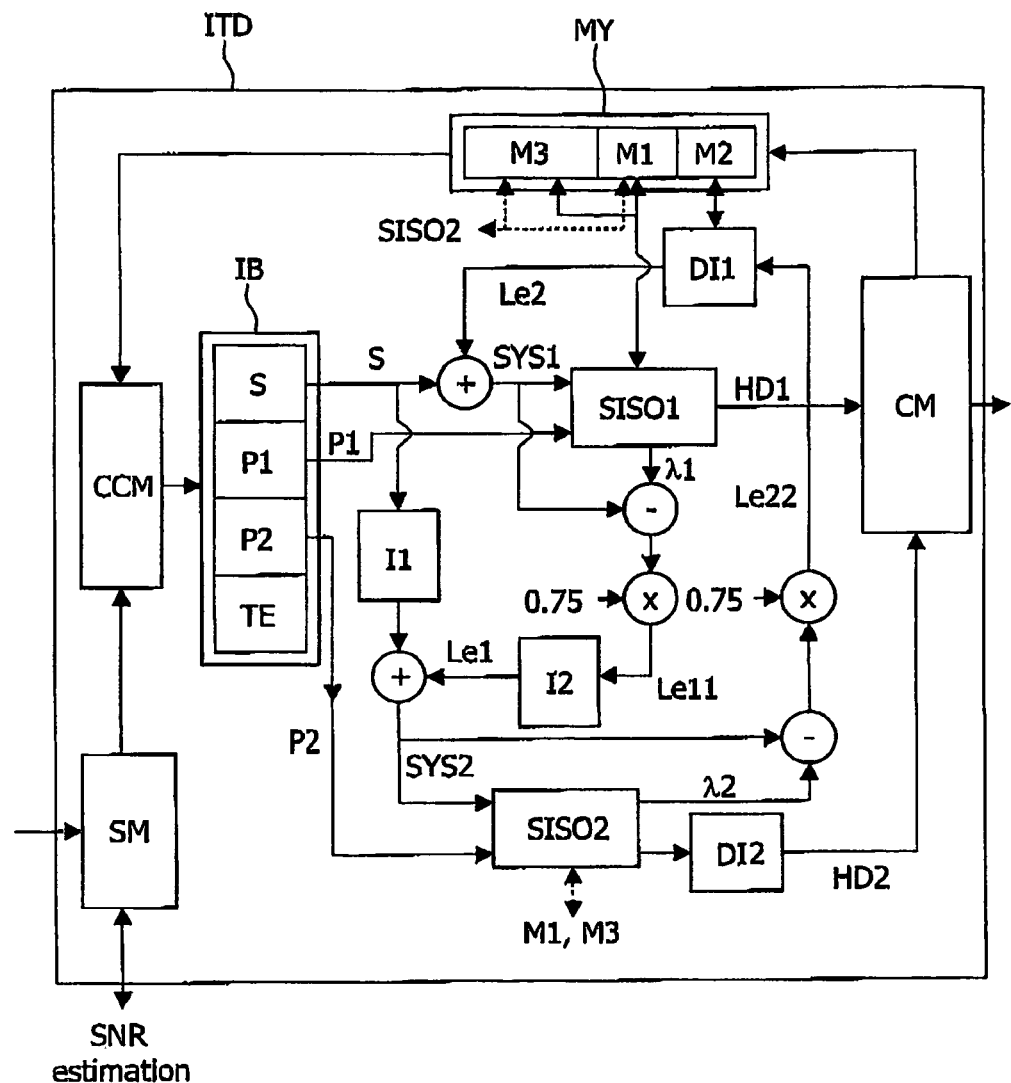

US 7,984,365 B2

TURBO DECODER WITH STAKE HERITAGE FOR DATA BLOCK REDUNDANT VERSION DECODING

FIELD OF THE INVENTION

The present invention relates to the domain of binary data decoding, and more precisely to the decoding devices and methods adapted for decoding data blocks encoded with turbo codes in an iterative manner.

BACKGROUND OF THE INVENTION

As it is known by one skilled in the art, the turbo codes are frequently used in digital communication systems to encode binary data to be transmitted through a transmission channel, for instance between a base station of a communication network and terminal equipment, such as third generation (3G) UMTS wireless equipment. Indeed, transmission channels frequently corrupt the transmitted signals inducing errors in received signals and the use of turbo codes allows a proper error protection. In order to encode binary sequences to be transmitted, split into blocks, transmission equipment (for instance a base station—or Node B—of a UMTS communication network) comprises a turbo encoder fed with data blocks (named systematic data or vector S) and adapted to apply a first recursive convolutional encoding of the vector S to generate a first parity vector P1 and, in parallel, to apply a second recursive convolutional encoding of the vector S, interleaved by a known vector component permutation, to generate a second parity vector P2. The systematic and the encoded vectors (or sequences) are then multiplexed according to a given scheme and modulated according to a given modulation, for instance, such as the ones defined by 3GPP specifications. The resulting signal is sent over a transmission channel to terminal (or user) equipment, itself comprising a receiver device supporting turbo decoding.

To decode the encoded data blocks, receiver equipment comprises a turbo decoder. Such a turbo decoder generally comprises an input buffer to store the encoded received sequence composed of RS, RP1 and RP2 respectively representing the sub-sequences S, P1 and P2, a first and a second SISO sub-decoder ("Soft Input Soft Output"), a first and a second interleaver, two de-interleavers and an iteration control module. The encoded received sequence composed of RS, RP1 and RP2 (representing S, P1 and P2), are processed in an iterative manner under the control of the iteration control module. A turbo decoder of this type is notably described in the patent documents WO 03/098811 and U.S. Pat. No. 6,732,327.

Some of the proposed turbo decoders use a so-called "sliding window" algorithm to process the received sequence composed of RS, RP1 and RP2. In an improvement of the sliding window algorithm, named "next iteration initialization", forward and backward recursive calculations are used on sub-blocks of the data block, which is defined by the received sequences. Backward calculations are performed to determine for each sub-block and during each iteration, a set of state metrics (sometimes named a stake) that is used during the next iteration to determine a next metric set (or stake) till a final metric set (or stake) is obtained during the final iteration. Finally, the validity of each sub-block of the processed data block is established by an independent unit, which performs a CRC check.

In release 99 UMTS, if the CRC check fails, the decoded data is simply discarded. In release 5 UMTS, if the CRC check fails, an "ACK/NACK" message is sent back to the base station to acknowledge or ask for retransmission. This procedure is called HARQ ("Hybrid Automatic Repeat Request) and has been introduced for HSDPA ("High Speed Downlink Packet Access").

This new downlink packet access HSDPA, evolution of the WCDMA and defined by the specification HSDPA 3G TR 25.212 of the 3GPP, requires a data decoding faster than the one provided by the known iterative turbo decoders.

SUMMARY OF THE INVENTION

So, the object of this invention is to provide an improved iterative turbo decoder adapted to HSDPA implementation.

For this purpose, it provides an iterative decoding device (or turbo decoder) comprising a means for decoding received encoded data blocks (or vectors) by means of the next iteration initialization mechanism (which is a sliding window algorithm), in order to determine final stakes associated to the sub-blocks of a received encoded data block to compute first and second hard decision bits, and a control means arranged to choose one of said first and second hard decision bits in order for the validity of the CRC field, associated to this received data block, to be checked.

This iterative decoding device is characterized in that it comprises a first memory means, and in that its control means is arranged, when the CRC field of a received block is invalid, i) to order the decoding means to store the final stakes associated to this block in the first memory means, to require the transmission of a redundant version of this block, and iii) when the redundant version is received, to initialize the decoding means with the stored final stakes before it applies the sliding window algorithm to the received redundant version.

The iterative decoding device according to the invention may include additional characteristics considered separately or combined, and notably:

its first memory means may be arranged to store N groups of final stakes associated to N successive and different blocks respectively, with N greater than one. A group comprises at least one final stake associated to one block. The number of final stakes in a group depends on the number of retransmitted redundant versions of the associated block Moreover, N groups of final stakes are stored because retransmission can arrive after N transmissions of other blocks, its decoding means may be arranged to determine during each iteration an extrinsic information item to be combined with a chosen part of the received block in order to deliver an a priori information item, and its control means may be arranged, when the CRC field of a received block is invalid, to order the decoding means to store a final extrinsic information item determined by the decoding means during the final iteration in a second memory means, and when the redundant version is received, to initialize the decoding means with the stored final extrinsic information item before it applies the sliding window algorithm to the received redundant version, the second memory means may be arranged to store N groups of final extrinsic information items associated to N redundant versions of the received block respectively, with N greater than one, a third memory means in which its control means may store accumulated information on the erroneous blocks, and a combining means arranged to apply a Chase combination with the information contained in each redundant version of a block received last by adding it to the corresponding information stored in the third memory means and associated to anterior redundant versions of said block, before transmitting the redundant version received last with the corresponding Chase-combined information to the decoding means.

The invention also provides a communication receiver, for instance adapted to HSDPA communications and comprising an iterative decoding device such as the one introduced above. Such communication equipment may be part of communication equipment, such as a mobile phone (or user equipment), for instance.

The invention also provides an iterative decoding method, consisting in applying the so-called next iteration initialization mechanism to a received encoded data block to divide it into a chosen number of sub-blocks, then in subjecting each of these sub-blocks during each iteration to forward and backward recursive calculations to determine a set of state metrics defining a stake to be used during the next initialization in order to determine a next stake till a final stake is obtained during the final iteration, and then in checking the validity of a CRC field associated to the block with the final stakes associated to each of its sub-blocks.

This method is characterized in that, when the CRC field of a block is invalid:
i) the final stakes associated to this block are stored,
ii) transmission of a redundant version of the block is required, and
iii) when the redundant version is received, the next iteration initialization mechanism is applied to the received redundant version and then each of the sub-blocks is subjected during each iteration to the forward and backward recursive calculations, with a first iteration during which the stored final stakes are used as initialization stakes.

Moreover, during each final iteration one may determine an extrinsic information item to be combined with a chosen part of the block in order to deliver an a priori information item, and when the CRC field of a block is invalid, the extrinsic information item determined during the final iteration is stored, and when the redundant version is received, the next iteration initialization mechanism is applied to the received redundant version and then each of its sub-blocks is subjected during each iteration to the forward and backward recursive calculations, with a first iteration during which the stored extrinsic information item is used as initialization extrinsic information item.

Other features and advantages of the invention will become apparent on examining the detailed specifications hereafter and the appended drawing, wherein the unique FIGURE schematically illustrates an iterative turbo decoder according to the invention.

BRIEF DESCRIPTION OF THE DRAWING

The appended drawing may not only serve to complete the invention, but also to contribute to its definition, if need be.

Reference is made to the unique FIGURE to describe an example of iterative turbo decoder (or decoding device) ITD according to the invention.

DESCRIPTION OF PREFERRED EMBODIMENTS

In the following description it will be considered that the iterative turbo decoder ITD is intended for a communication receiver of communication equipment such as a mobile phone (or user equipment) adapted to radio communication in a UMTS network, and more precisely to HSDPA. But it is important to notice that the invention is neither limited to this type of communication equipment nor to this type of communication network.

The mobile phone is arranged to transmit data packets to a base station (Node B) of the UMTS network and to receive data packets from a base station (Node B) through a HS-DSCH channel, which is composed of HS-PDSCH channels. Moreover, the base stations of the UMTS network and the mobile phone are adapted to implement the HARQ mechanism in order to allow a selective retransmission of wrong decoded packets (or blocks) as described in the specification HSDPA 3G TR 25.212 of the 3GPP.

It is recalled that the HARQ mechanism consists of the following steps (for the sake of simplicity it will be assumed that the receiver only receives one data transport block with an associated CRC field, but it could receive N blocks (N>1)).

In a first step the base station (Node B) transmits a HS-DSCH data transport block (or encoded data block) n°X to the mobile phone, through a HS-DSCH channel.

In a second step the mobile phone receives the HS-DSCH data transport block n X and transmits it to its iterative turbo decoder ITD (which will be described below).

In a third step the iterative turbo decoder ITD decodes the encoded data block n°X and an external unit checks whether its associated CRC field is valid or not. If the CRC field is valid, the block n°X is used by the mobile phone. If the CRC field is invalid the iterative turbo decoder ITD generates a non-acknowledgement message ("NACK") to require retransmission of block n°X. This NACK message is then transmitted by the mobile phone to the base station concerned.

In a fourth step the base station receives the NACK message and retransmits a redundant version of block n°X to the mobile phone in order for it to try to successfully decode it.

The invention is dedicated to the turbo decoding of the received redundant versions of data blocks.

As illustrated in the sole FIGURE, an iterative turbo decoder ITD comprises at least an input buffer IB to momentarily store the received data blocks, a first decoder SISO1, a second decoder SISO2, a first interleaver I1, a second interleaver I2, a first de-interleaver DI1, a second de-interleaver DI2, several electronic combiners (such as adders (+), subtracters (−), and multipliers (×)), and a control module CM.

Preferably and as illustrated, the iterative turbo decoder ITD also comprises a scaling module SM, dedicated to compute optimal log likelihood input metrics and supporting a signal-to-noise ratio (SNR) estimation, and a Chase combining module CCM dedicated to combine the information associated to the different redundant versions of a data block retransmitted by the base station according to the HARQ mechanism. It is recalled that Chase combining is done before scaling by a quantity, which depends on the SNR of the resulting chase combined sequence.

As mentioned in the introductory part, each encoded data block is transmitted in the form of multiplexed sub-sequences (or vectors) S (or systematic information), P1 (or first parity information) and P2 (or second parity information). When the iterative turbo decoder ITD receives an encoded data block, it stores vectors S, P1 and P2 at three different locations of its input buffer 1B, respectively.

Each received encoded data block (hereafter the "block") is decoded in an iterative manner under the control of the control module CM.

During the first iteration the systematic information S of the block is transferred from the input buffer 1B to the first decoder SISO1 through a first adder (+) while the first parity information P1 is transferred directly from the input buffer IB to the first decoder SISO1.

In the first adder (+) the systematic information S is added to a first extrinsic information item Le2 and the result of this addition "SYS1" (which is named "a priori information") is fed to the first decoder SISO1. According to the invention, the first extrinsic information item Le2 is initialized at zero (0). Therefore, the first a priori information SYS1, which is fed to the first decoder SISO1, is equal to the received systematic information S.

The first decoder SISO1 is preferably of the NII Soft Input Soft Output type. It is arranged to apply the next iteration initialization mechanism to SYS1 and P1. In other words, SYS1 and P1 are divided into a chosen number of sub-blocks, which are subjected to forward and backward recursive calculations.

The forward recursive calculations are executed through the whole block to determine metric states $\alpha_k(s)$ associated to each of its sub-blocks. The backward recursive calculations are executed through an ending part of the block to determine metric states $\beta_k(s)$ also associated to each of its sub-blocks and this recursion is initiated using the set of metrics (or stake) computed in previous iteration.

For each sub-block (and for each iteration), a first subset of state metrics is thus determined by the first decoder SISO1. This first subset defines a stake, which is stored to be used by the first decoder SISO1 during the next iteration to determine a next stake (for the same corresponding sub-block) till a final stake is obtained during a final iteration. The stake metrics are the "boundary" backward metrics of each sub-block.

It is important to notice that at the beginning of the first iteration only the backward recursive calculations start with initialization stakes equal to zero (0). The forward metrics, instead, are computed in a continuous way, carrying results from one sub-block to another.

The number of state metrics of a first subset associated to one sub-block depends on the encoding implemented by the turbo encoder. For instance, if every bit to be transmitted has been encoded according to a systematic recursive convolutional code of memory equal to 3, then each first subset comprises $2^3=8$ state metrics.

The information $\lambda 1$ outputted by the first decoder SISO1 is subtracted from the a priori information SYS1 in a first subtracter (−) and the result of this subtraction is fed to a first multiplier (×) where it is multiplied by 0.75 to become a scaled information item Le11. This scaled information Le11 is interleaved in the second interleaver I2 to become another extrinsic information item Le1, which is fed to a second adder (+).

In this second adder (+) the other extrinsic information item Le1 is added to a copy of the systematic information which has been interleaved by the first interleaver I1. The result of this addition "SYS2" (which is also named "a priori information") is fed to the second decoder SISO2, which is also fed with the second parity information P2.

The second decoder SISO2 is also preferably of the NII Soft Input Soft Output type. It is also arranged to apply the next iteration initialization mechanism to SYS2 and P2. In other words, SYS2 and P2 are divided into the chosen number of sub-blocks, which are subjected to the forward and backward recursive calculations.

For each sub-block (and for each iteration), a second subset of state metrics is thus determined by the second decoder SISO2 in the same way as the first decoder SISO1. This second subset also defines a stake, which is stored to be used by the second decoder SISO2 during the next iteration to determine a next stake (for the same corresponding sub-block) till a final stake is obtained during a final iteration.

The number of state metrics of a second subset associated to one sub-block also depends on the encoding implemented by the turbo encoder. For instance, if every bit to be transmitted has been encoded according to a systematic recursive convolutional code of memory equal to 3, then each first subset comprises $2^3=8$ state metrics.

The information $\lambda 2$ outputted by the second decoder SISO2 is subtracted from the a priori information SYS2 in a second subtracter (−) and the result of this subtraction is fed to a second multiplier (×) where it is multiplied by 0.75 to become another scaled information item Le22. This other scaled information item Le22 is then de-interleaved in the first de-interleaver DI1 to become the (second) extrinsic information item Le2 which is ready to be fed to the first adder (+) during the second iteration.

So the data block process comprises the same operations during each iteration up to the final (or last) one.

During the final iteration the first decoder SISO1 determines the final first subsets (final stakes) respectively associated to each sub-block of the processed block, and delivers a first hard decision bit HD1 to the control module CM.

The first hard decision bit HD1 is representative of the sign of $\lambda$. For instance a hard decision bit HD1 equal to 1 corresponds to sign + whereas a hard decision bit HD1 equal to 0 corresponds to sign −.

Also during the final iteration the second decoder SISO2 determines the final second subsets (final stakes) associated to each sub-block of the processed block, and outputs the "decoded interleaved block", which is fed to the second de-interleaver DI2. This second de-interleaver DI2 de-interleaves the decoded interleaved block and outputs a second hard decision bit HD2, which is fed to the control module CM.

The second hard decision bit HD2 is also representative of the sign of $\lambda$. For instance a hard decision bit HD2 equal to 1 corresponds to sign + whereas a hard decision bit HD2 equal to 0 corresponds to sign −.

The control module CM chooses if the hard decision HD1 of the first decoder SISO1 or the hard decision HD2 of the second decoder SISO2 must deliver the final decoded hard data sequence.

Then an external CRC unit checks whether the CRC field, which is associated to the processed block, is valid or not. In other words, it checks whether the processed block comprises error(s) or not.

According to the invention, in case where the CRC field is invalid (or does not exactly correspond to the processed erroneous block), the control module CM orders the first SISO1 and second SISO2 to store the final stakes they have determined and which are associated to the erroneous block in first M1 and third M3 parts of a memory MY.

Still according to the invention, in case where the CRC field is invalid, the control module CM may order the first de-interleaver DI1 to store the final extrinsic information item Le2, associated to the processed erroneous block, in the second part M2 of the memory MY.

Then the control module CM generates a NACK message to be transmitted to the base station in order for the base station to retransmit a redundant version of the processed block.

It is important to notice that the iterative turbo decoder ITD may receive one or more new encoded data blocks before receiving a first redundant version of an erroneous block received previously. Therefore, each time a new block is processed the extrinsic information item Le2 and the stakes are initialized at zero.

When the iterative turbo decoder ITD receives a first redundant version of the erroneous block, the control module CM orders the first SISO1 and second SISO2 to retrieve the final stakes corresponding to this erroneous block from the first part M1 of the memory MY, in order to use them as initialization stakes.

This allows to notably reduce the time necessary for decoding the redundant version.

In the case where the iterative turbo decoder ITD is adapted to store the final (or last) extrinsic information item Le2, outputted by its first de-interleaver DI1 during the final iteration, the control module CM preferably orders the first de-interleaver DI1, before the first iteration is started, to retrieve the extrinsic information item Le2, corresponding to the erroneous block, from the second part M2 of the memory MY, in order to use it as an initialization extrinsic information item Le2.

This allows to still more reduce the time necessary to decode the redundant version because fewer iterations are needed.

It is important to notice that each redundant version of a previously received encoded data block is processed in the same iterative manner as this encoded data block.

The size of the first part M1 of the memory MY is preferably independent of the number N of retransmissions allowed by the HARQ mechanism.

Moreover, when N redundant versions of a data block can be retransmitted, the size of the first part M1 of the memory MY is adapted to store N groups of final stakes respectively associated to the N redundant versions (with N>1).

For instance, if the maximum size of a data block is equal to 5114 bits, the window size (or the sub-block size) is equal to 63 bits, the number of different states is equal to 8 and the state metric bit width is equal to 8, then the maximum size of the first part M1 of the memory MY is equal to N*10368 bits, taking into account the fact that there are two decoders SISO1 and SISO2.

Similarly, when N redundant versions of a data block can be retransmitted, the size of the third part M3 of the memory MY is adapted to store N groups of final extrinsic information item Le2 respectively associated to the N redundant versions (with N>1).

For instance, if the maximum size of a data block is equal to 5114 bits, and the state metric bit width is equal to 8, then the maximum size of the third part M3 of the memory MY is equal to N*30684 bits.

As mentioned above, the control module CM can order the first SISO1 and second SISO2 decoders to store the final stakes which are associated to an erroneous block and to its successively received redundant versions.

It is effectively possible that one or more redundant versions of a same block be erroneous. Then, to ease the decoding of the transmitted block, the above mentioned and well-known Chase combining module CCM can be used.

More precisely the Chase combining module is arranged to add retransmitted information items one by one to the accumulated information of the erroneous blocks.

The iterative turbo decoder ITD may be an integrated circuit (for instance an ASIC) realized in any technology used in chip industry fabrication. But it may also be implemented as software.

The invention is not limited to the embodiments of iterative turbo decoder, communication receiver, communication equipment and iterative decoding method described above, only as examples, but it encompasses all alternative embodiments which may be considered by one skilled in the art to be within the scope of the claims hereafter.

The invention claimed is:

1. An iterative decoding device, comprising a decoder for decoding received encoded data blocks by a next iteration initialization including dividing said encoded data block in a chosen number of sub-blocks to determine with forward and backward recursive calculations, for each of said sub-blocks and for each iteration, a set of state metrics defining a stake to be used during a next iteration to determine a next stake until a final stake is obtained during a final iteration to compute first and second hard decision bits, and a control module to choose one of said first and second hard decision bits in order for the validity of a CRC field to be checked, which is associated to this received data block, wherein said iterative decoding device comprises a first memory, and in that said control module, when the CRC field of a block is invalid, orders said decoder to store the final stakes associated to said block in said first memory, to require transmission of a redundant version of said block, and when said redundant version is received, to initialize said decoder with said stored final stakes before it applies said next iteration initialization mechanism to said received redundant version.

2. The iterative decoding device according to claim 1, wherein said first memory stores N groups of final stakes associated to N successive and different blocks respectively, with N greater than one, each group comprising at least one final stake associated to one block, and the number of final stakes in a group depending on the number of retransmitted redundant versions of the associated block.

3. The iterative decoding device according to claim 1, further comprising a second memory, wherein said decoder determines during each iteration an extrinsic information item to be combined with a chosen part of said block in order to deliver an a priori information item, and wherein said control module, when the CRC field of a block is invalid, orders said decoder to store in said second memory a final extrinsic information item it has determined during said final iteration, and when said redundant version is received, to initialize said decoder with said stored final extrinsic information item before it applies said next iteration initialization mechanism to said received redundant version.

4. The iterative decoding device according to claim 3, wherein said second memory stores N groups of final extrinsic information items respectively associated to N redundant versions of said block, with N greater than one.

5. The iterative decoding device according to claim 1, further comprising a third memory, wherein said control module orders said decoder to store accumulated information on the erroneous blocks and a combining module to apply a Chase combining to the information contained in each final received redundant version of a block by adding it with the corresponding information stored in said third memory and associated to anterior redundant versions of said block, before transmitting to said decoder the redundant version received last with the corresponding Chase combined information.

6. A communication receiver comprising an iterative decoding device according to claim 1.

7. The communication receiver according to claim 6, adapted to HSDPA (High Speed Downlink Packet Access) communications.

8. Communication equipment comprising a communication receiver according to claim 6.

9. The Communication equipment according to claim 8 comprising a mobile phone.

10. An iterative decoding method of operation of an integrated circuit, comprising:

applying therein a next iteration initialization to a received encoded data block to divide it into a chosen number of sub-blocks;

subjecting therein each of said sub-blocks during each iteration to forward and backward recursive calculations to determine a set of state metrics defining a stake to be used during a next initialization in order to determine a next stake until a final stake is obtained during a final iteration; and checking therein the validity of a CRC field associated to said block with the final stakes associated to each of its sub-blocks, wherein, when the CRC field of a block is invalid, the final stakes associated to said block are stored, transmission of a redundant version of said block is required, and when said redundant version is received, said next iteration initialization is applied to said received redundant version and then each of said sub-blocks is subjected during each iteration to said forward and backward recursive calculations, with a first iteration during which said stored final stakes are used as initialization stakes.

11. The iterative decoding method according to claim 10, wherein during each final iteration an extrinsic information item is determined to be combined with a chosen part of said block in order to deliver an a priori information item, and in that, when the CRC field of a block is invalid, the extrinsic information is stored, determined during said final iteration, and when said redundant version is received, said next iteration initialization mechanism is applied to said received redundant version and then each of said sub-blocks is subjected during each iteration to said forward and backward recursive calculations, with a first iteration during which said stored extrinsic information is used as initialization extrinsic information.

* * * * *